(12) United States Patent
Ryochi et al.

(10) Patent No.: US 9,354,258 B2
(45) Date of Patent: May 31, 2016

(54) CURRENT DETECTION DEVICE AND ELECTRICITY METER

(75) Inventors: Shinichi Ryochi, Kawasaki (JP);
Mitsuhiro Sakoyama, Yokohama (JP);
Fuyuki Kurokawa, Yokohama (JP);
Tatsuya Kimura, Musashino (JP)

(73) Assignee: Toshiba Toko Meter Systems Co., Ltd., Tokyo (JP)

( * ) Notice: Subject to any disclaimer, the term of this patent is extended or adjusted under 35 U.S.C. 154(b) by 93 days.

(21) Appl. No.: 14/127,354

(22) PCT Filed: Dec. 2, 2011

(86) PCT No.: PCT/JP2011/077958
§ 371 (c)(1),
(2), (4) Date: Dec. 18, 2013

(87) PCT Pub. No.: WO2013/005352
PCT Pub. Date: Jan. 10, 2013

(65) Prior Publication Data
US 2014/0111190 A1    Apr. 24, 2014

(30) Foreign Application Priority Data
Jul. 1, 2011    (JP) .................................. 2011-147461

(51) Int. Cl.
*G01R 19/00* (2006.01)
*G01R 15/18* (2006.01)
*H01F 38/30* (2006.01)

(52) U.S. Cl.
CPC .............. *G01R 19/00* (2013.01); *G01R 15/186* (2013.01); *H01F 38/30* (2013.01)

(58) Field of Classification Search
CPC ....................................................... G01R 15/18
See application file for complete search history.

(56) References Cited

U.S. PATENT DOCUMENTS

| | | | | | |
|---|---|---|---|---|---|
| 4,709,205 | A | * | 11/1987 | Baurand | G01R 15/181 324/127 |
| 4,749,940 | A | * | 6/1988 | Bullock | G01R 15/18 324/117 R |

(Continued)

FOREIGN PATENT DOCUMENTS

| | | |
|---|---|---|
| CN | 101802623 A | 8/2010 |
| EP | 2 188 641 | 3/2011 |

(Continued)

OTHER PUBLICATIONS

Kimura et al JP 20100256141 A, published Nov. 11, 2010, Machine translation attached as PDF.*

(Continued)

*Primary Examiner* — Jermele M Hollington
*Assistant Examiner* — Suresh K Rajaputra
(74) *Attorney, Agent, or Firm* — Oblon, McClelland, Maier & Neustadt, L.L.P.

(57) ABSTRACT

A device including: a conductor through which a current to be measured flows; multiple coils arranged around the conductor; a first magnetic body provided to face one of end surfaces of each of the multiple coils and configured to magnetically short-circuit the multiple coils; and a second magnetic body provided to face another one of the end surfaces of each of the multiple coils, configured to magnetically short-circuit the multiple coils, and including through-holes through which coil wires from the multiple coils are passed, respectively, the through-holes being provided at positions facing the other end surfaces of the multiple coils, respectively.

2 Claims, 5 Drawing Sheets

(56) References Cited

U.S. PATENT DOCUMENTS

| | | | | | |
|---|---|---|---|---|---|
| 4,952,853 | A | * | 8/1990 | Archer | G01R 15/185 318/284 |
| 5,066,904 | A | * | 11/1991 | Bullock | G01R 15/185 323/357 |
| 5,177,433 | A | * | 1/1993 | Schwendtner | G01R 11/06 324/117 R |
| 5,296,802 | A | * | 3/1994 | Beranger | G01R 15/148 324/117 R |
| 5,343,143 | A | * | 8/1994 | Voisine | G01R 11/067 324/107 |
| 5,414,400 | A | * | 5/1995 | Gris | H01F 5/003 336/174 |
| 5,430,613 | A | * | 7/1995 | Hastings | H01F 1/0027 29/606 |
| 5,453,681 | A | * | 9/1995 | Berkcan | G01R 15/18 323/357 |
| 5,486,755 | A | * | 1/1996 | Horan | G01R 22/066 324/110 |
| 5,563,506 | A | * | 10/1996 | Fielden | G01R 21/133 324/142 |
| 5,617,019 | A | * | 4/1997 | Etter | G01R 15/186 324/117 R |
| 5,834,932 | A | * | 11/1998 | May | G01R 11/04 324/107 |
| 5,839,185 | A | * | 11/1998 | Smith | H01F 3/04 156/191 |
| 5,841,272 | A | * | 11/1998 | Smith | G01R 15/146 324/117 H |
| 5,917,401 | A | * | 6/1999 | Smith | G01R 1/203 29/610.1 |
| 6,008,711 | A | * | 12/1999 | Bolam | H01F 38/30 324/107 |
| 6,016,054 | A | * | 1/2000 | Slater | G01R 11/20 324/138 |
| 6,043,641 | A | * | 3/2000 | Singer | G01R 15/181 324/115 |
| 6,130,599 | A | * | 10/2000 | Juds | H01L 43/06 257/E43.002 |
| 6,184,672 | B1 | * | 2/2001 | Berkcan | G01R 15/181 324/117 R |
| 6,414,475 | B1 | * | 7/2002 | Dames | G01R 15/18 324/127 |
| 6,441,605 | B1 | * | 8/2002 | Baurand | G01R 15/186 324/117 R |
| 6,456,061 | B1 | * | 9/2002 | Criniti | G01R 35/02 324/127 |
| 6,566,854 | B1 | * | 5/2003 | Hagmann | G01R 29/0857 324/117 R |
| 6,680,608 | B2 | * | 1/2004 | Kojovic | G01R 15/181 324/117 R |
| 6,774,759 | B2 | * | 8/2004 | Kolody | H01H 85/0241 324/126 |
| 6,822,547 | B2 | * | 11/2004 | Saito | G01R 15/181 336/200 |
| 7,105,974 | B2 | * | 9/2006 | Nashiki | H02K 21/145 310/156.08 |
| 7,129,692 | B2 | * | 10/2006 | Omura | G01R 31/315 324/117 R |
| 7,154,368 | B2 | * | 12/2006 | Sweeney | H01F 41/08 336/229 |
| 7,180,717 | B2 | * | 2/2007 | Kojovic | H02H 3/28 361/62 |
| 7,227,442 | B2 | * | 6/2007 | Skendzic | H01F 5/003 336/229 |
| 7,307,410 | B2 | * | 12/2007 | Shiokawa et al. | 324/76.11 |
| 7,532,000 | B2 | * | 5/2009 | Kovach | G01R 15/181 324/117 H |
| 7,538,541 | B2 | * | 5/2009 | Kojovic | G01R 15/181 324/127 |
| 7,564,233 | B2 | * | 7/2009 | Kojovic | G01R 15/181 324/117 R |
| 7,638,999 | B2 | * | 12/2009 | Kojovic | H02H 1/0007 324/127 |
| 7,902,812 | B2 | * | 3/2011 | Kojovic | 324/117 R |
| 7,936,165 | B2 | * | 5/2011 | Matsumura | G01R 15/207 324/117 H |
| 8,217,643 | B2 | * | 7/2012 | Kuroki et al. | 324/117 H |
| 8,299,779 | B2 | * | 10/2012 | Kern | G01R 15/183 324/117 H |
| 8,796,971 | B2 | * | 8/2014 | Tsuboi | H02K 11/0073 310/71 |
| 2002/0135354 | A1 | * | 9/2002 | Hirose | G01R 1/203 324/127 |
| 2005/0068149 | A1 | | 3/2005 | Fushimi | |
| 2006/0081397 | A1 | * | 4/2006 | Enchi | H05K 1/165 174/260 |
| 2007/0152651 | A1 | * | 7/2007 | Shiokawa | H01F 5/003 324/76.11 |
| 2007/0252577 | A1 | * | 11/2007 | Preusse | 324/117 R |
| 2010/0301836 | A1 | | 12/2010 | Kern | |
| 2011/0012590 | A1 | * | 1/2011 | Kuroki | G01R 15/207 324/142 |

FOREIGN PATENT DOCUMENTS

| | | | | |
|---|---|---|---|---|
| JP | 5-118461 | A | 5/1993 | |
| JP | 2005-37297 | | 2/2005 | |
| JP | 2010-256141 | | 11/2010 | |
| JP | 2010256141 | A | * 11/2010 | G01R 15/18 |
| JP | 2010-539451 | | 12/2010 | |
| JP | 2011-89883 | | 5/2011 | |
| JP | 2011089883 | A | * 5/2011 | G01R 15/18 |
| WO | WO 94/20860 | A1 | 9/1994 | |
| WO | WO 2009/034440 | A2 | 3/2009 | |

OTHER PUBLICATIONS

Kimura et al JP 2011089883 A, published May 6, 2011 Machine translation attached as PDF.*

Japanese Office Action issued Mar. 3, 2015 in Patent Application No. 2011-147461 (with English Translation).

Australian Office Action issued Mar. 10, 2015 in Patent Application No. 2011372577.

Extended European Search Report issued Feb. 20, 2015 in Patent Application No. 11868916.5.

Combined Chinese Office Action and Search Report issued Feb. 10, 2015 in Patent Application No. 201180071779.0 (with English Translation).

Australian Office Action issued Oct. 2, 2014 in Patent Application No. 2011372577.

International Search Report issued Jan. 31, 2012, in PCT/JP11/077958 filed Dec. 2, 2011.

Canadian Office Action issued May 11, 2015 in Patent Application No. 2,840,021.

* cited by examiner (a)

(b)

CURRENT DETECTION DEVICE AND ELECTRICITY METER

TECHNICAL FIELD

The present invention relates to a current detection device which detects the magnitude of current flowing through a conductor by magneto-electric conversion, and also an electricity meter using the current detection device.

BACKGROUND ART

A current detection device configured to detect a load current in a house, a factory, an office, or the like is conventionally known. The current detection device includes, for example, a primary conductor configured to produce a magnetic field when a load current flows therethrough, and a magneto-electric convertor configured to detect the magnetic field produced by the primary conductor (see, for example, Patent Literature 1).

The magneto-electric convertor is formed of a coil formed by winding a conducting wire, such as an enamel wire, around a donut-shaped magnetic core called a toroidal core. Winding the conductive wire around the magnetic core takes a lot of work, and therefore poses a problem of increasing the costs of the current detection device.

To overcome such a problem, Patent Literature 2 discloses a current detection device including a primary conductor configured to produce a magnetic field which is in direct proportion to a measured current, multiple coil portions configured to detect the magnetic field produced by the primary conductor 11, and support portions made of a magnetic material, configured to support the multiple coil portions, and connected to the multiple coil portions in series magnetically with wires, the coil portions and the support portions being provided around the primary conductor. The current detection device is configured to output electric signals from output terminals through the wires, the electric signals being generated by the multiple coil portions based on the magnetic field produced by the primary conductor.

FIG. 1 is a schematic diagram showing the configuration of a conventional, general current detection device, like the one disclosed by Patent Literature 2. This current detection device includes a primary conductor 11 configured to produce a magnetic field in accordance with the magnitude of a measured current, a first coil 12 and a second coil 13 configured to detect the magnetic field produced by the primary conductor 11, and a first magnetic body 14 and a second magnetic body 15 configured to support and magnetically short-circuit the first coil 12 and the second coil 13, the first and second coils 12 and 13 and the first and second magnetic bodies 14 and 15 being provided around the primary conductor 11. The current detection device is configured to output an electric signal generated by the first coil 12 based on the magnetic field produced by the primary conductor 11 from an output terminal 17 through a wire and to output an electric signal generated by the second coil 13 based on the magnetic field produced by the primary conductor 11 from an output terminal 18 through a wire.

CITATION LIST

Patent Literatures

Patent Literature 1 Japanese Patent Application Publication No. 2005-37297

Patent Literature 2 Japanese Patent Application Publication No. 2010-256141

SUMMARY OF INVENTION

Technical Problem

However, the conventional current detection device described above has a structure which requires the wires to be led from the first coil 12 and the second coil 13 to the output terminal 17 and the output terminal 18, respectively, and therefore has a problem of poor manufacturability due to the wire-leading work, which contributes to an increase in costs.

The present invention has an objective of providing a current detection device and an electricity meter excellent in manufacturability and inexpensive.

Solution to Problems

To solve the above problem, a current detection device according to the present invention includes: a conductor through which a current to be measured flows; a plurality of coils arranged around the conductor; a first magnetic body provided to face one end surfaces of the respective plurality of coils and configured to magnetically short-circuit the plurality of coils; and a second magnetic body provided to face the other end surfaces of the respective plurality of coils, configured to magnetically short-circuit the plurality of coils, and provided with through-holes through which coil wires from the plurality of coils are passed, respectively, the through-holes being provided at positions facing the other end surfaces of the plurality of coils, respectively.

In addition, an electricity meter according to the present invention includes: the above-described current detection device; a voltage detection unit configured to detect voltage generated in the conductor; and an electricity computation unit configured to compute electricity or an amount of electricity based on a current detected by the current detection device and on the voltage detected by the voltage detection unit.

DESCRIPTION OF EMBODIMENTS

Figure 1:
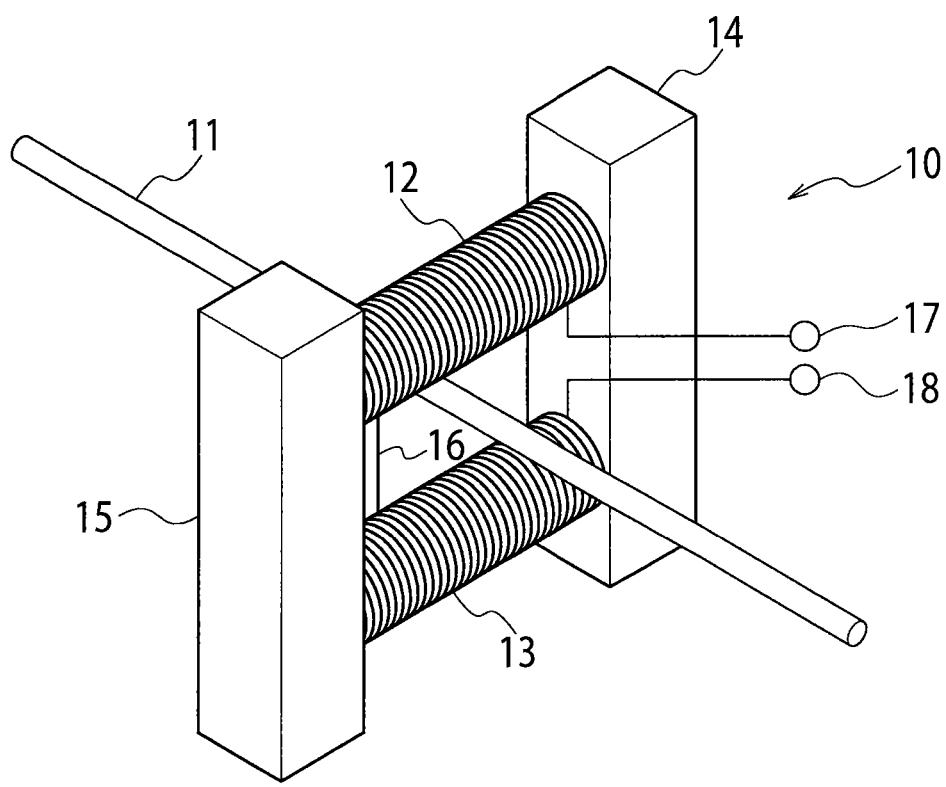
FIG. 1 is a diagram illustrating a conventional current detection device.

Embodiments of the present invention are described in detail below with reference to the drawings. In the following description, portions that are the same as or correspond to components of the conventional current detection device described in the section Background Art are given the same reference numerals as those used in the Background Art section.

Embodiment 1

Figure 2:
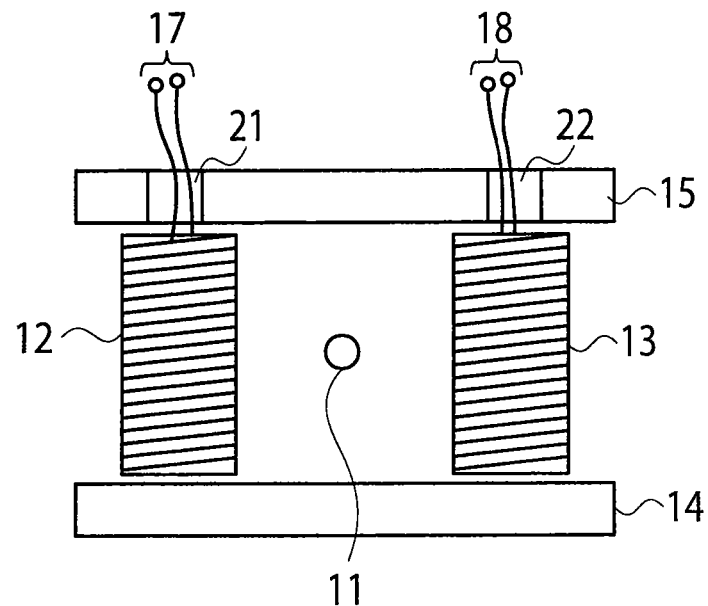
FIG. 2 is a schematic diagram showing the configuration of a current detection device according to Embodiment 1 of the present invention.

FIG. 2 is a schematic diagram showing the configuration of a current detection device according to Embodiment 1 of the present invention. This current detection device includes a linear primary conductor 11 and a first coil 12, a second coil 13, a first magnetic body 14, and a second magnetic body 15 which are placed around the primary conductor 11.

The primary conductor 11 corresponds to the "conductor" in the present invention, and is made of conductive metal such as iron or copper. The primary conductor 11 is configured to produce a magnetic field when a load current which is a measured current flows therethrough.

The first coil 12 and the second coil 13 correspond to the "plurality of coils" in the present invention, and are each configured by winding a conductive wire, such as an enamel wire, around a non-conductive core material made of phenol, bakelite, or the like. In each of the first coil 12 and the second coil 13, electromotive force in accordance with a current flowing through the primary conductor 11 is induced and is outputted as an electric signal.

The first coil 12 and the second coil 13 each may have a core material of a hollow structure or may have a core material completely filled with material. Alternatively, the core material may be a magnetic body made of ferrite, permalloy, or the like. The first coil 12 and the second coil 13 may alternatively not include a core material, but be formed by bonding parts of a conductive coil wire together with a bond such as a welding material or an adhesive.

The first magnetic body 14 and the second magnetic body 15 are made of ferrite, parmally, or the like, and placed at positions sandwiching the first coil 12 and the second coil 13.

By such placement, the first magnetic body 14 is provided facing one of end surfaces of each of the first coil 12 and the second coil 13 (lower end surfaces in FIG. 2), and magnetically short-circuits the first coil 12 and the second coil 13.

The second magnetic body 15 is provided facing the other end surface of each of the first coil 12 and the second coil 13 (upper end surfaces in FIG. 2), and magnetically short-circuits the first coil 12 and the second coil 13. The second magnetic body 15 is provided with a through-hole 21 through which the coil wire from the first coil 12 is led to output terminals 17 and a through-hole 22 through which the coil wire from the second coil 13 is led to output terminals 18, the through-holes 21 and 22 being provided at predetermined positions, specifically, at a position facing the other end surface of the first coil 12 and a position facing the other end surface of the second coil 13, respectively.

The output terminals 17 are configured to output the electric signal generated by the first coil 12 according to the current flowing through the primary conductor 11. The output terminals 18 are configured to output the electric signal generated by the second coil 13 according to the current flowing through the primary conductor 11.

Next, a description is given of operation of the current detection device configured as above. In response to a magnetic field produced by the primary conductor 11 by a current flowing therethrough, the first coil 12 and the second coil 13 generate, in their conductive coil wires, electric signals in accordance with the current. The conductive coil wire of the first coil 12 is connected to the output terminals 17, and the electric signal in accordance with the current flowing through the primary conductor 11 is outputted to the output terminals 17. Similarly, the conductive coil wire of the second coil 13 is connected to the output terminals 18, and the electric signal in accordance with the current flowing through the primary conductor 11 is outputted to the output terminals 18. These electric signals outputted to the output terminals 17 and 18 represent the magnitude of the current flowing through the primary conductor 11.

The current detection device according to Embodiment 1 described above may have a structure in which the first coil 12 and the second coil 13 are connected to the first magnetic body 14 and the second magnetic body 15 by fitting the first coil 12 and the second coil 13 into recess portions formed in the first magnetic body 14 and the second magnetic body 15, respectively. Alternatively, the current detection device may have a structure in which the first coil 12 and the second coil 13 are fixed to the first magnetic body 14 and the second magnetic body 15 with an adhesive or the like. Further, the first coil 12 and the second coil 13 do not have to be in contact with the first magnetic body 14 and the second magnetic body 15, and the current detection device may have a structure in which they are fixed by being loaded into a case made of resin or the like.

As described above, the current detection device according to Embodiment 1 of the present invention is configured such that the conductive coil wires from the first coil 12 and the second coil 13 are passed through the through-holes 21 and 22 formed in the second magnetic body 15 to pass the coil wires therethrough, and are then connected to the output terminals 17 and 18, respectively. This configuration can facilitate the wire-leading work and decrease labor hours in manufacture. As a result, the manufacturability can be improved, and also, costs can be reduced.

Embodiment 2

Figure 3:
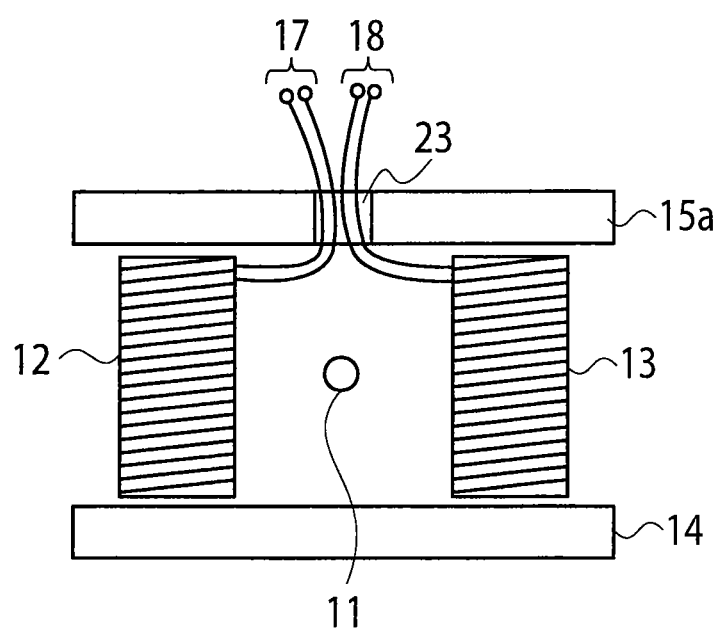
FIG. 3 is a schematic diagram showing the configuration of a current detection device according to Embodiment 2 of the present invention.

FIG. 3 is a schematic diagram showing the configuration of a current detection device according to Embodiment 2 of the present invention. This current detection device is the same as the current detection device according to Embodiment 1, except that the second magnetic body 15 of the current detection device according to Embodiment 1 is modified into a second magnetic body 15a. Portions different from those of the current detection device according to Embodiment 1 are mainly described below.

The second magnetic body 15a is provided to face the other end surface of each of the first coil 12 and the second coil (upper end surfaces in FIG. 3), and magnetically short-circuits the first coil 12 and the second coil 13. The second magnetic body 15a is provided with a through-hole 23 through which the coil wire from the first coil 12 is led to the output terminals 17 and the coil wire from the second coil 13 is led to the output terminals 18, the through-hole 23 being provided at a predetermined position, specifically, a position except for a position facing the other end surface of the first coil 12 and a position facing the other end surface of the second coil 13.

The current detection device according to Embodiment 2 of the present invention is configured such that the conductive coil wires from the first coil 12 and the second coil 13 are passed through the single through-hole 23 formed in the second magnetic body 15a to pass the coil wires therethrough, and are then connected to the output terminals 17 and 18, respectively. This configuration can facilitate the wire-leading work and decrease labor hours in manufacture. As a result, the manufacturability can be improved, and also, costs can be reduced.

Further, since the through-hole 23 through which the coil wires from the first coil 12 and the second coil 13 are passed is provided at the position except for the positions facing the other end surfaces of the first coil 12 and the second coil 13, the other end portions of the first coil 12 and the second coil are covered by the magnetic body. This can improve disturbance resistance.

Although the current detection device according to Embodiment 2 described above has the single through-hole 23 formed in the second magnetic body 15a, multiple through-holes can be provided as long as they are provided at positions except for the position facing the other end surface of the first coil 12 and the position facing the other end surface of the second coil 13.

Embodiment 3

Figure 4:
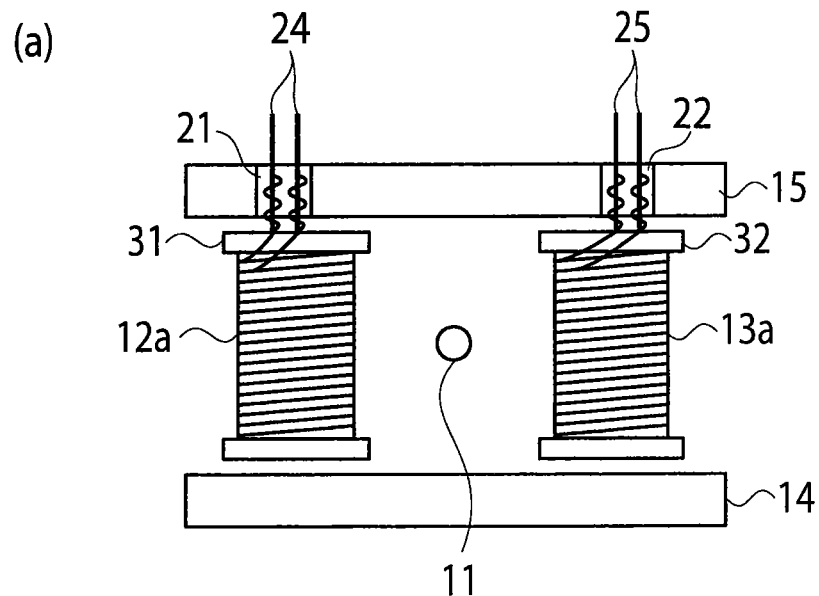
FIG. 4 is a schematic diagram showing the configuration of a current detection device according to Embodiment 3 of the present invention and the configuration of a current detection device according to a modification of Embodiment 3.
Figure 4:
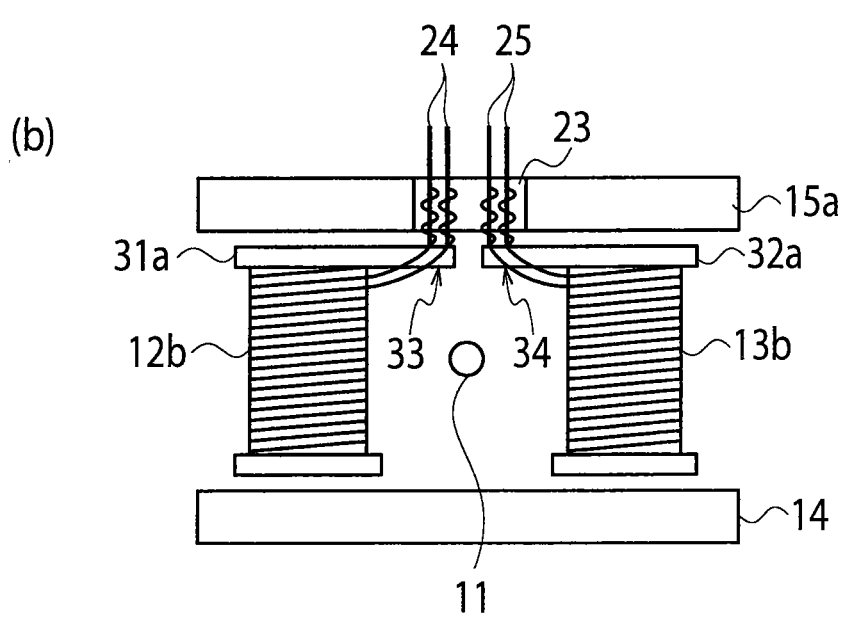

FIG. 4(a) is a schematic diagram showing the configuration of a current detection device according to Embodiment 3 of the present invention. This current detection device is the same as the current detection device according to Embodiment 1, except that the first coil 12 and the second coil 13 of the current detection device according to Embodiment 1 are modified into a first coil 12a and a second coil 13a each formed by winding a conductive coil wire around a bobbin. Portions different from those of the current detection device according to Embodiment 1 are mainly described below.

The first coil 12a and the second coil 13a correspond to the "plurality of coils" in the present invention. The first coil 12a is formed of a bobbin-wound coil formed by winding a conductive coil wire around a bobbin 31. The start and the end of this conductive coil wire are bundled by pin terminals 24. Similarly, the second coil 13a is formed of a bobbin-wound coil formed by winding a conductive coil wire around a bobbin 32. The head and the tail of this conductive coil wire are bundled by pin terminals 25. The bobbins 31 and 32 are made of, for example, a PBT (polybutylene terephthalate) resin.

Since the current detection device according to Embodiment 3 of the present invention has the first coil 12a and the second coil 13a which are bobbin-wound coils, leading of the wires is unnecessary, and labor hours in manufacture can be reduced. As a result, the manufacturability can be improved, and also, costs can be reduced.

The current detection device according to Embodiment 3 can be modified as follows. FIG. 4(b) is a schematic diagram showing the configuration of a current detection device according to a modification of Embodiment 3 of the present invention. This current detection device is the same as the current detection device according to Embodiment 3, except that the first coil 12a and the second coil 13a of the current detection device according to Embodiment 3 are modified into a first coil 12b and a second coil 13b by changing the flange shapes of the bobbins 31 and 32 of the first coil 12a and the second coil 13a. Portions different from those of the current detection device according to Embodiment 3 are mainly described below.

The first coil 12b and the second coil 13b correspond to the "plurality of coils" in the present invention. Part of a flange of a bobbin 31a of the first coil 12b on the second magnetic body 15a side extends to a position facing the through-hole 23 of the second magnetic body 15a. The conductive coil wire of the first coil 12b is passed through the through-hole 23 by an extension portion 33 of the flange and then connected to the output terminals 24.

Part of a flange of a bobbin 32a of the second coil 13b on the second magnetic body 15a side extends to a position facing the through-hole 23 of the second magnetic body 15a. The conductive coil wire of the second coil 13b is passed through the through-hole 23 by an extension portion 34 of the flange and connected to the output terminals 25.

The current detection device according to the modification of Embodiment 3 can not only offer the effect offered by the current detection device according to Embodiment 3, but also reduce labor hours in manufacture even more. As a result, the manufacturability can be improved, and also, costs can be reduced.

Embodiment 4

Figure 5:
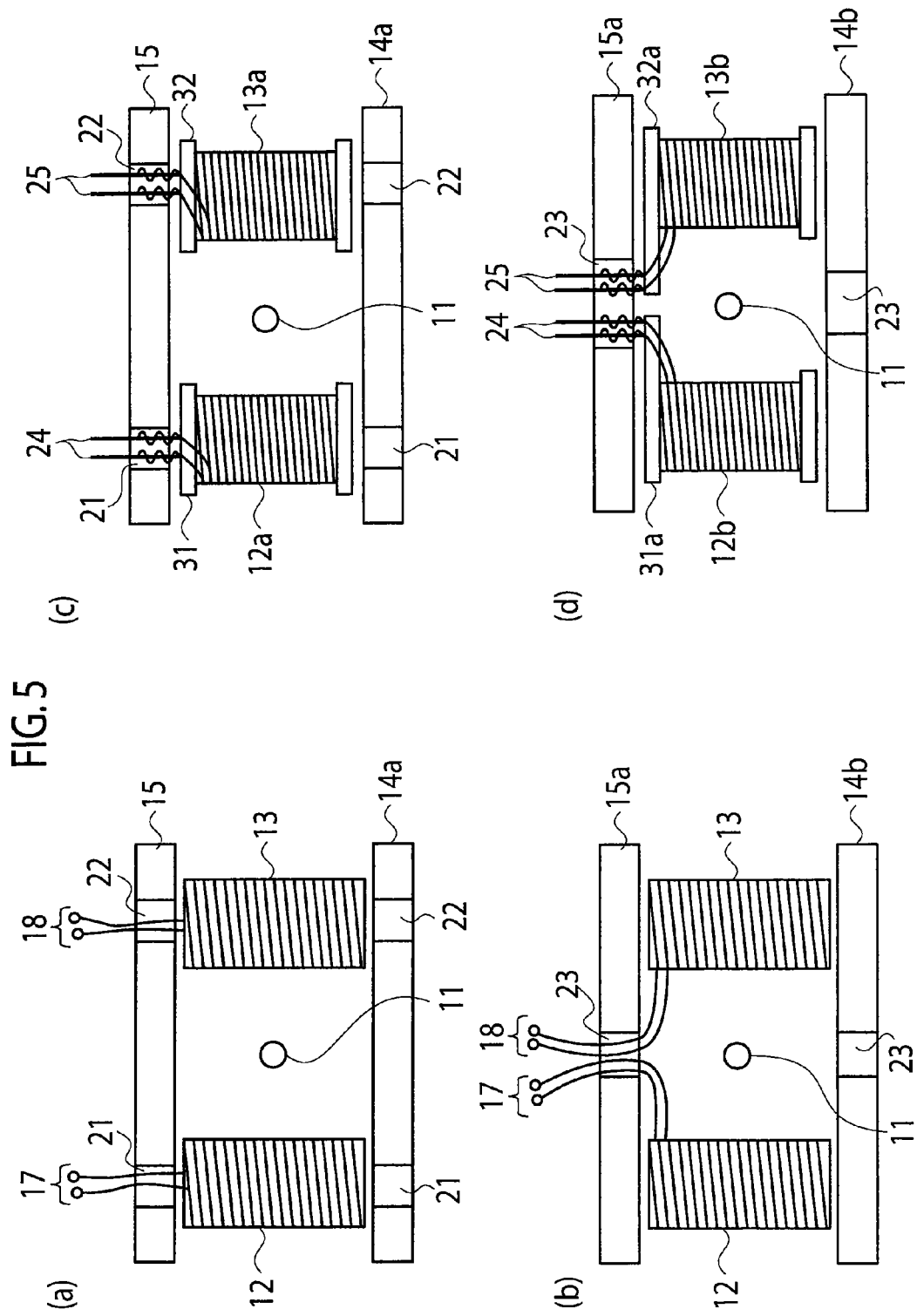
FIG. 5 is a schematic diagram showing the configurations of current detection devices according to Embodiment 4 of the present invention.

FIG. 5 is schematic views showing the configurations of current detection devices according to Embodiment 4 of the present invention. These current detection devices correspond to those according to Embodiments 1 to 3, and are each obtained by making a second magnetic body have the same shape as a first magnetic body. Portions different from those of the current detection devices according to Embodiments 1 to 3 are mainly described below.

FIG. 5(a) shows a current detection device obtained by modifying the first magnetic body 14 of the current detection device according to Embodiment 1 into a first magnetic body 14a having the same shape as the second magnetic body 15.

FIG. 5(b) shows a current detection device obtained by modifying the first magnetic body 14 of the current detection device according to Embodiment 2 into a first magnetic body 14b having the same shape as the second magnetic body 15a.

FIG. 5(c) shows a current detection device obtained by modifying the first magnetic body 14 of the current detection device according to Embodiment 3 into a first magnetic body 14a having the same shape as the second magnetic body 15.

FIG. 5(d) shows a current detection device obtained by modifying the first magnetic body 14 of the current detection device according to the modification of Embodiment 3 into a first magnetic body 14b having the same shape as the second magnetic body 15a.

With the above configurations shown in FIGS. 5(a) to 5(d), the first magnetic body and the second magnetic body can be formed of the same components, and therefore the number of kinds of components can be reduced, which can reduce the costs.

Embodiment 5

Figure 6:
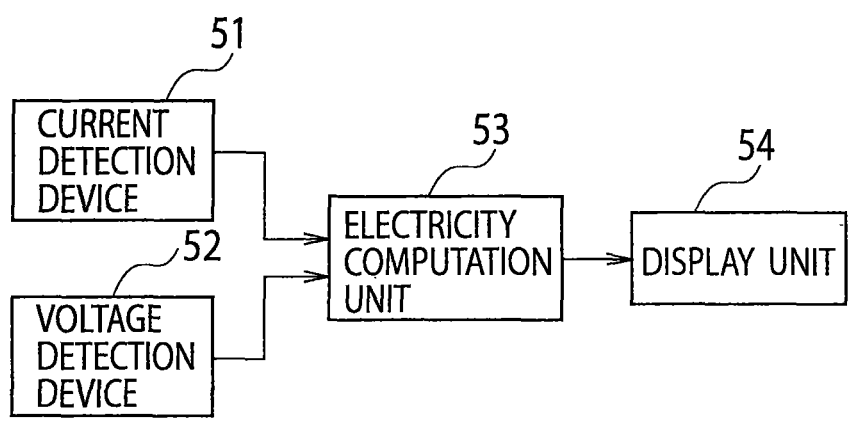
FIG. 6 is a block diagram showing the configuration of an electricity meter according to Embodiment 5 of the present invention.

Embodiment 4 of the present invention is an electricity meter using any of the current detection devices according to Embodiments 1 to 4 described above. FIG. 6 is a block diagram showing the configuration of the electricity meter according to Embodiment 4. This electricity meter includes a current detection device 51, a voltage detection unit 52, an electricity computation unit 53, and a display unit 54.

Any of the current detection devices according to Embodiments 1 to 4 described above is used as the current detection device 51. The current detection device 51 is configured to detect a current used by a load of a consumer (a use current A1), convert the used current into a corresponding electric signal, and output the electric signal.

The voltage detection unit 52 is a portion for detecting voltage in a measured system, is formed of an attenuator such as a voltage-dividing resistor and a voltage transformer, and the like, and is configured to detect a voltage used by a load of a consumer (a use voltage V1), convert the use voltage into a low-level voltage signal in direct proportion to the use voltage, and output the voltage signal.

The electricity computation unit 53 is configured to compute the amount of electricity based on the current flowing through the conductor 11 and detected by the current detection device 51 and the voltage detected by the voltage detection unit 52. Specifically, the electricity computation unit 53 is formed of a digital multiplier circuit, a DSP (digital signal processor), and the like, and is configured to multiply the signal related to the use current (A1) outputted from the current detection device 51 with the signal related to the use voltage (V1) outputted from the voltage detection unit 52, and thereby convert the signals into data (A1·V1) in direct proportion to electricity used by the consumer.

The electricity computation unit 53 further edits the computation result of the data (A1·V1) in direct proportion to the used electricity and thereby obtains used amount data, and outputs the used amount data. Here, the used amount data refers to data related to electricity used by a consumer, such as the total accumulated amount of electricity used by the load of the consumer, and the amount used for each time-zone.

The signal related to the use current (A1) outputted from the current detection device 51 is, except for a case where the core material of each coil is a magnetic body, a signal in direct proportion to a signal obtained by differentiating the use current (A1), and is therefore integrated by the electricity computation unit 53 before being converted into the data (A1·V1) in direct proportion to the electricity used by the consumer. The display unit 54 is formed of a crystal liquid display or the like, and is configured to display the used amount data.

As described above, according to the electricity meter according to Embodiment 5 of the present invention, an electricity meter having a current detection device which does not require many labor hours to manufacture, has excellent manufacturability, and allows reduction in costs can be provided.

The present invention can facilitate the wire-leading work, improve manufacturability, and reduce costs.

The invention claimed is:

1. A current detection device comprising:
a conductor through which a current to be measured flows;
two bobbin-wound coils arranged around the conductor;
a first magnetic body provided to face one end surface of each of the two bobbin-wound coils and configured to magnetically short-circuit the two bobbin-wound coils, the first magnetic body being provided with a through-hole in between the end surfaces of the two bobbin-wound coils; and
a second magnetic body provided to face another end surface of each of the two bobbin-wound coils and configured to magnetically short-circuit the two bobbin-wound coils, the second magnetic body being provided with a through-hole in between the end surfaces of the two bobbin-wound coils, wherein
the two bobbin-wound coils have same shapes,
the first magnetic body and the second magnetic body have same shapes, and
output terminals from the two bobbin-wound coils are passed through either the through-hole of the first magnetic body or the through-hole of the second magnetic body.

2. An electricity meter comprising:
the current detection device according to claim 1;
a voltage detection unit configured to detect voltage generated in the conductor, and
an electricity computation unit configured to compute electricity or an amount of electricity based on a current detected by the current detection device and the voltage detected by the voltage detection unit.

* * * * *